United States Patent [19]

Stegens

[11] 4,365,195

[45] Dec. 21, 1982

[54] COPLANAR WAVEGUIDE MOUNTING STRUCTURE AND TEST FIXTURE FOR MICROWAVE INTEGRATED CIRCUITS

[75] Inventor: Ronald E. Stegens, Brookerville, Md.

[73] Assignee: Communications Satellite Corporation, Washington, D.C.

[21] Appl. No.: 108,247

[22] Filed: Dec. 27, 1979

[51] Int. Cl.³ .......................................... G01R 31/02
[52] U.S. Cl. ................................ 324/158 F; 333/246
[58] Field of Search ................... 324/158 F, 95, 58 R, 324/58 A, 64; 333/243, 245, 246, 247

[56] References Cited

U.S. PATENT DOCUMENTS

| | | | |
|---|---|---|---|
| 3,590,372 | 6/1971 | De Santis | 324/64 |
| 3,697,902 | 10/1972 | Louvel | 333/246 |
| 3,775,644 | 11/1973 | Cotner et al. | 324/158 F |

*Primary Examiner*—Ernest F. Karlsen

*Attorney, Agent, or Firm*—Sughrue, Mion, Zinn, Macpeak & Seas

[57] ABSTRACT

A versatile test structure for coplanar waveguide (CPW) microwave integrated circuits is provided with a support structure or carrier which accommodates any length of CPW circuit. The carrier is provided with a shock mounting means for a CPW substrate which protects the substrate against physical damage, as well as damage caused by widely varying thermal coefficients of expansion. The carrier is provided at each end thereof with a sliding connector to inject or remove microwave energy from the CPW substrate via a coaxial connector. The sliding connector and the carrier together comprise a mounting structure for the substrate which may be further provided with a sliding energy sampler or a right-angle CPW transition which may be used to sample energy levels within the substrate, or test individual portions of a CPW circuit.

10 Claims, 9 Drawing Figures

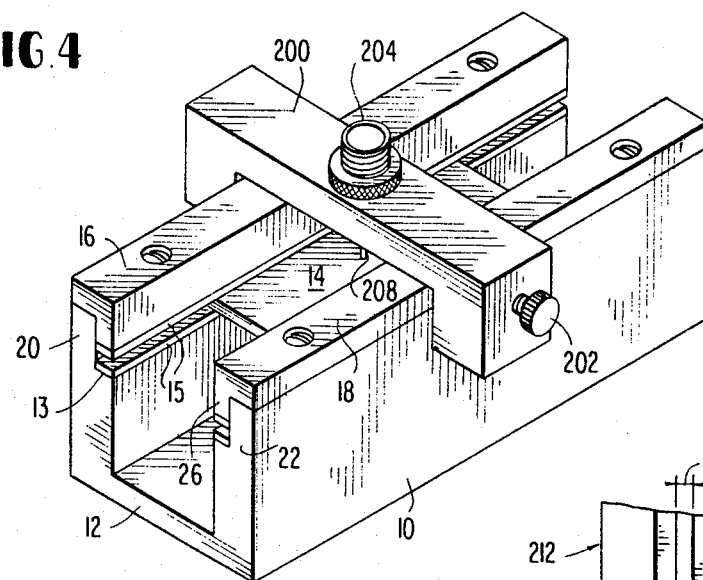
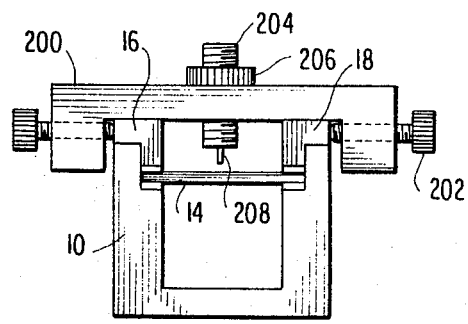
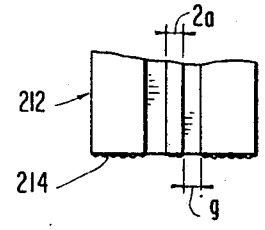
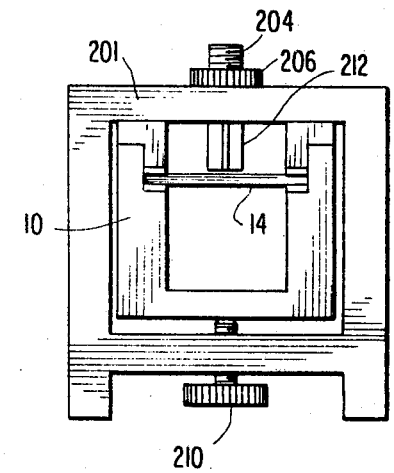
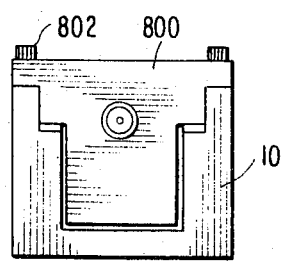

COPLANAR WAVEGUIDE MOUNTING STRUCTURE AND TEST FIXTURE FOR MICROWAVE INTEGRATED CIRCUITS

BACKGROUND OF THE INVENTION

1. Field of the Invention

The present invention relates to a substrate holder or carrier for a coplanar waveguide (CPW) microwave circuit, and more particularly to such a holder which is provided with sliding connector carriers and a sliding energy sampler for use in testing microwave circuits.

2. Description of the Prior Art

One type of prior art substrate holder, as described in U.S. Pat. No. 3,775,644 issued to Cotner et al, includes an adjustable microstrip substrate holder which can accommodate various size substrates. The fixture comprises a hollow rectangular frame and substrate clamps with a connector bracket mounted upon rails for establishing connection with the substrate. However, a disadvantage of such a holder is that it does not allow the use of a sliding energy sampler in combination with a substrate carrier which may be used to test energy levels within the substrate.

Other prior art devices which are representative of the state of the art are described in U.S. Pat. No. 3,757,219 issued to Aksu, U.S. Pat. No. 4,112,363 issued to Morrison, and U.S. Pat. No. 3,590,377 issued to Sorger.

SUMMARY OF THE INVENTION

The present invention relates to a substrate holder which overcomes the above disadvantages found in the holders of the prior art. A generally U-shaped substrate carrier is provided to hold the substrate, and a pair of sliding connector carriers are fit over the ends thereof to make electrical connections with the substrate. The carrier is further provided with a sliding energy sampler having a probe, or a right angle CPW transition which is used for testing purposes.

It is therefore a primary object of this invention to provide a substrate holder which may be used with substrates of various sizes.

It is a further object of this invention to provide sliding connector carriers which are engageable with the holder and facilitate the establishment of electrical connection with the substrate.

It is a still further object of this invention to provide a sliding device mountable on the holder or carrier which may be used to sample energy levels within, and otherwise test, a CPW substrate.

These, together with other objects and advantages which will become subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 4 is a perspective view of the substrate carrier fitted with a sliding energy sampler;

FIG. 5 is an end view of the sliding energy sampler of FIG. 4;

FIG. 6 is an end view of a substrate carrier fitted with a sliding energy sampler in the form of a right angle CPW—CPW transition;

FIG. 7 is a detailed view of the CPW transmission line of FIG. 6; and

FIG. 8 is a perspective view of a substrate carrier having a permanent connector carrier affixed thereto.

DETAILED DESCRIPTION OF THE PREFERRED EMBODIMENTS

Figure 1:
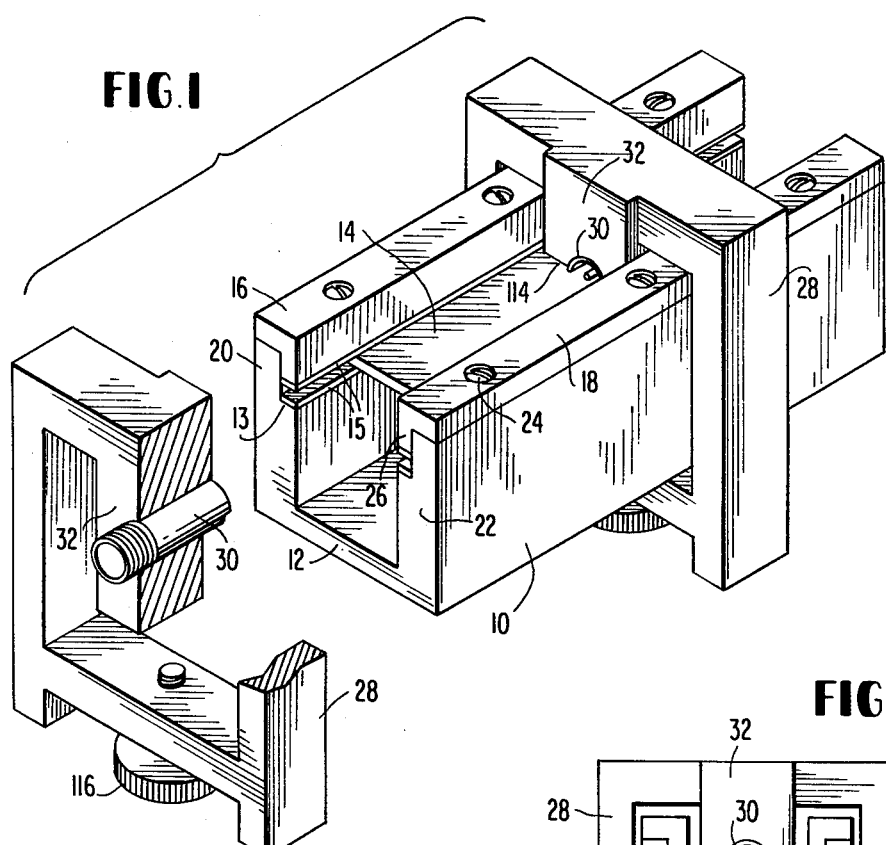
FIG. 1 is a perspective view of a substrate carrier fitted with a pair of sliding connector carriers according to the present invention.

Referring now to the drawings and in particular to FIG. 1, there is shown a substrate carrier generally designated at 10. The carrier assembly includes a base member 12 generally formed in the shape of a trough having a substantially U-shaped cross-section. The base 12 is provided with ledges 13 formed therein to act as a support for a CPW substrate 14. Between the ledges and the substrate, there is provided gasketing 15 of a compressible, conductive type which is used to ensure a good ground contact along the edges of the substrate. Due to its compressibility, the gasketing allows for different thermal expansion coefficients of the substrate.

To secure the CPW substrate in place, carrier clamps 16 and 18 are provided which fit over the arms 20 and 22 of the U-shaped carrier, and are adjustably connected thereto by means of fasteners 24. The clamps are each provided with portions 26 which extend into the carrier base member 12 and abut the top surfaces of the substrate 14. Portions 26 are provided with gasketing 15 in the same manner as ledges 13, it being noted that the metalized circuit plane of the CPW substrate may be either on the top or bottom surface thereof, or both. Any number of substrates may be easily cascaded in the carrier provided that their cumulative length does not exceed that of the carrier itself, and substrates of different thicknesses may be accommodated by merely altering the length of the clamp portion 26, or by using a suitable shim when the substrate is very thin. Of course, longitudinal movement of the substrate within the carrier may easily be effected by merely loosening fasteners 24. If desired, the space below the substrate may be resistively loaded in order to suppress spurious modes.

Figure 2:
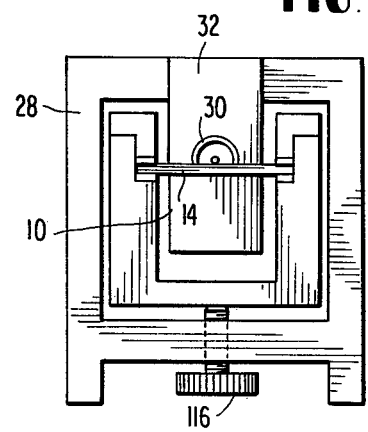
FIG. 2 is an end view of the substrate carrier fitted with a sliding connector carrier.

Referring now to FIG. 2, there is illustrated a sliding connector carrier which is used in conjunction with the substrate carrier as previously described. The sliding connector carrier 28 (hereinafter referred to as SCC) is adapted to fit over the ends of the substrate carrier, and support the same while at the same time providing a connection between the CPW substrate 14 and a coaxial connector 30. As seen in FIG. 2, the SCC is adapted to receive the end of the substrate carrier within an aperture provided therein with a close, sliding fit, the SCC being provided with an inwardly protruding portion 32 which is received within the U-shaped carrier 10. Received within portion 32 is a coaxial connector 30 which is adapted for connection to the end of substrate 14 by means of pressure contacts, it being assumed for the purpose of example that the conductor plane of the substrate lies on the top surface thereof.

Figure 3:
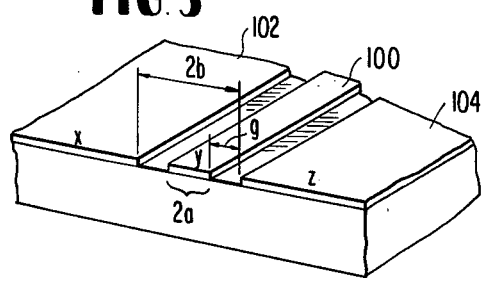
FIG. 3 is an enlarged perspective view of the connector interface region of a CPW substrate.
Figure 3A:
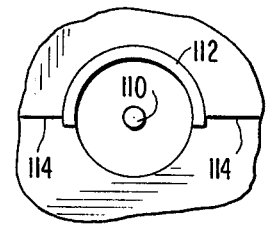
FIG. 3a illustrates a coaxial connector operable to be connected with the substrate of FIG. 3.

FIGS. 3 and 3a illustrate a typical CPW substrate and the means by which it is connected to the coaxial connector. As seen in FIG. 3, the connector interface of the substrate is provided with a center conductor 100 of transverse dimension 2*a* separated by gaps *g* on either side thereof from ground plane conductors 102, 104 separated by distance 2*b*. The substrate 14 which carriers the coplanar RF conductive surfaces is typically formed of a plate of 0.050" thick $Al_2O_3$ with a dielectric constant of approximately 10.0. Typical dimensional values at the connector interface for use in the 12 Ghz range may be as follows:

$2a \approx 0.025''$
$2b \approx 0.050''$
$g \approx 0.0125''$ where the values are selected so as to match the physical dimensions of the coaxial connector, the value 2*a* being approximately equal to the diameter of the center conductor of the coaxial line and the value 2*b* being roughly equal to the diameter of the outer coaxial conductor. For a characteristic impedance of 50Ω, the ratio of a/b must be kept at a value of approximately 0.5, and therefore the values a and b must be selected to match not only the physical dimensions of the coaxial connector, but the impedance of the connector at the interface as well, to reduce the reflection coefficient at the CPW-coax interface.

In FIG. 3*a*, a coaxial connector 30 is illustrated which is adapted to be matched with the CPW of FIG. 3. The connector is provided with an inner conductor 110 for connection to center conductor 100 and a circular outer conductor 112 for connection to ground plane conductors 102,104. As it is necessary to maintain a good connection at the three points x, y and z of the CPW (FIG. 3) at all times, the outer conductor 112 is provided with a leaf conductor 114 which is adapted to provide a yieldable pressure contact with the ground plane conductors 102, 104 at points x and z thereof. As is illustrated in FIG. 2, the contact pressure may be limited by the use of an adjustable thumb screw 116 which raises or lowers the substrate carrier 10.

While only one CPW-coaxial cable connection has been described, it should be noted that two identical connections are provided by two substantially identical SCC's, as shown in FIG. 1. Although the SCC members are specifically adapted to provide a connection at the end of a CPW substrate, FIG. 1 illustrates that they may clearly be used even when the substrate 14 is substantially shorter than the substrate carrier 10, because of the slidability of the SCC on the carrier. In this figure, the connector carrier shown on the right-hand side has been fitted onto the substrate carrier 10 at the right-hand side thereof, and has been slidably moved to the left thereon to a position where the leaf conductor 114 and the coax center conductor 110 are able to make contact with the conductive surfaces of the substrate.

For testing the CPW substrate, or for sampling energy levels at any point along its surface, the substrate carrier may be further provided with a sliding energy sampler, or SES. As shown in FIG. 4, the SES 200 is formed substantially in the shape of an inverted U and is adapted to be slidably engageable with the substrate carrier 10 and carrier clamps 16, 18. Locking screws 202 may be provided through apertures in the SES 200 to releasably secure the SES in position during a given energy sampling operation.

The SES is provided with an aperture in the top thereof through which may be inserted a coaxial connector 204, which is held in place by a lock nut 206. As seen in FIG. 5, the coaxial connector 204 is provided at the end thereof with a vertically adjustable probe 208 for testing the CPW substrate by the "slotted line" technique, as well known in the art, wherein the substrate carrier is used as a "slotted line". A similar use of the "slotted line" method of microwave circuit testing is fully described in U.S. Pat. No. 3,470,469 to Ayer, the disclosure of which is hereby incorporated by reference. As previously mentioned, the probe 208 is vertically adjustable, this being accomplished by merely rotating the screw threaded connector 204.

Alternately, CPW testing may be accomplished without the use of a probe by utilizing a short section of vertical CPW line as a right angle transition as shown in FIG. 6. As shown in this figure, a sliding carrier 201 is provided which is substantially the same as that shown at 28 of FIG. 2 used in connection with the SCC. Here, however, the coaxial connector 204 is positioned vertically within the carrier 201 instead of horizontally. The connector 204 is suitably conductively connected to the vertical CPW line section 212 at the top thereof, the section 212 being positioned so as to extend vertically downward towards the substrate 14 to make a pressure contact therewith at a right angle. As was the case previously in connection with the SCC, thumb screw 210 is operable to adjust the contact pressure of the CPW-CPW connection. The carrier 201 of FIG. 6 may also be used in the device as shown in FIG. 5.

As seen in the exploded view of FIG. 7, the vertical CPW line 212 is provided with small "springs" 214 at the ends of the ground plane conductors thereof to ensure good contact. The "springs" 214 are formed of BeCu and exhibit both good conductivity and resilience, thus decreasing the probability of damaging the substrate 14. The CPW line 212 is connected at its upper end to the coaxial connector 204, and, when in contact with the substrate 14 may be used to sample the energy levels at points along the substrate, the results of which may be analyzed and compared with theoretical values.

After testing of the circuit has been completed, the same substrate carrier may be used as the final chassis for the tested circuit by removing the SCC and the SES therefrom. The substrate may then be permanently attached at its ends to coaxial connectors, and a top may be permanently affixed to the carrier as needed. As shown in FIG. 8, the substrate carrier 10 is provided with a permanent connector carrier (PCC) 800 affixed thereto. As the name implies, the permanent connector carrier is not slidable on the carrier 10, but is secured thereto by means of fasteners 802. Preferably, the PCC 800 is formed so that its surfaces complement those of the top, ledges, and bottom of the substrate carrier with a tight fit, incorporating seals if desired.

I claim:

1. A microwave integrated circuit substrate holder and device for R.F. testing of such circuits comprising:
    (a) a substrate carrier for holding at least one substrate,
    (b) a first means operable to engage and slide relative to the carrier and including means to establish electrical R.F. connection at two or more points on the substrate, and
    (c) a second means operable to engage and slide relative to the carrier and including means for testing the performance of the substrate.

2. The substrate holder and testing device of claim 1, wherein said substrate carrier is provided with a clamping means for securing the substrate within said substrate carrier.

3. The substrate holder and testing device of claim 2, wherein said clamping means and said substrate carrier are provided with a compressible, conductive gasketing material in an area which contacts the substrate.

4. The substrate holder and testing device of claim 1, wherein said first means comprises first and second connector carriers each including means to establish electrical contacts with the substrate.

5. The substrate holder and testing device of claim 4, wherein said means to establish electrical contact are substrate-coaxial connector interfaces.

6. The substrate holder and testing device of claim 4, wherein said first and second connector carriers are operable to slidably receive said substrate carrier.

7. The substrate holder and testing device of claim 1, wherein said second means comprises a frame slidable relative to the substrate carrier and provided with a probe for sampling energy levels within said substrate.

8. The substrate holder and testing device of claim 7, wherein said substrate carrier and said sliding connector carriers together comprise a coplanar waveguide "slotted line".

9. The substrate holder and testing device of claim 1, wherein said second means comprises a frame slidable relative to the substrate carrier and provided with a vertical section of coplanar waveguide line for testing individual portions of said substrate.

10. The substrate holder and testing device of claim 9, wherein said vertical section of coplanar waveguide line contacts the substrate by means of a conductive spring-like material.

* * * * *

UNITED STATES PATENT AND TRADEMARK OFFICE
CERTIFICATE OF CORRECTION

PATENT NO. : 4,365,195

DATED : December 21, 1982

INVENTOR(S) : Stegens, Ronald E.

It is certified that error appears in the above-identified patent and that said Letters Patent is hereby corrected as shown below:

Column 3, lines 4-5, change "carriers" to --carries--;

Column 3, line 26, change "matched" to --mated--.

Signed and Sealed this

Twelfth Day of April 1983

[SEAL]

Attest:

GERALD J. MOSSINGHOFF

Attesting Officer

Commissioner of Patents and Trademarks